United States Patent
Watanabe et al.

(10) Patent No.: US 6,791,802 B2
(45) Date of Patent: Sep. 14, 2004

(54) MAGNETIC HEAD DEVICE HAVING SUSPENSION WITH MICROACTUATOR BONDED THERETO

(75) Inventors: Mitsuru Watanabe, Niigata-ken (JP); Hidezi Sato, Niigata-ken (JP)

(73) Assignee: Alps Electric Co., Ltd., Tokyo (JP)

(*) Notice: Subject to any disclaimer, the term of this patent is extended or adjusted under 35 U.S.C. 154(b) by 3 days.

(21) Appl. No.: 10/081,245

(22) Filed: Feb. 21, 2002

(65) Prior Publication Data

US 2002/0118492 A1 Aug. 29, 2002

(30) Foreign Application Priority Data

Feb. 23, 2001 (JP) ........................... 2001-049351

(51) Int. Cl.$^7$ ............................ G11B 5/127; G11B 5/56
(52) U.S. Cl. .................................. 360/294.4; 29/603.06
(58) Field of Search ..................... 360/294.4; 29/603.06

(56) References Cited

U.S. PATENT DOCUMENTS

| | | | |
|---|---|---|---|
| 5,696,652 A | 12/1997 | Satoh | 360/104 |
| 5,764,444 A | 6/1998 | Imamura et al. | 360/109 |
| 5,898,544 A | 4/1999 | Krinke et al. | 360/104 |
| 6,046,888 A | 4/2000 | Krinke et al. | 360/104 |
| 6,239,953 B1 | 5/2001 | Mei | 360/294.6 |
| 6,552,878 B2 * | 4/2003 | Sato et al. | 360/294.4 |

* cited by examiner

Primary Examiner—David Davis
(74) Attorney, Agent, or Firm—Brinks Hofer Gilson & Lione (57) ABSTRACT

The present invention provides a magnetic head device exhibiting a good bonded state of a piezoelectric element and a load beam, and excellent reliability. The magnetic head device includes a slider provided with a reproducing element for detecting a magnetic signal recorded on a recording medium, and a recording element for recording a magnetic signal on the recording medium, an elastic supporting member for supporting the slider, and piezoelectric elements mounted on the elastic supporting member, for distorting the elastic supporting member to change the position of the slider. The piezoelectric element and the elastic supporting member are bonded together with a photo-curing and thermosetting epoxy adhesive resin having a Young's modulus of 1 GPa or more at 25° C., and a glass transition temperature of 90° C. or more.

2 Claims, 7 Drawing Sheets

MAGNETIC HEAD DEVICE HAVING SUSPENSION WITH MICROACTUATOR BONDED THERETO

BACKGROUND OF THE INVENTION

1. Field of the Invention

The present invention relates to a magnetic head device comprising a piezoelectric element.

2. Description of the Related Art

Figure 6:
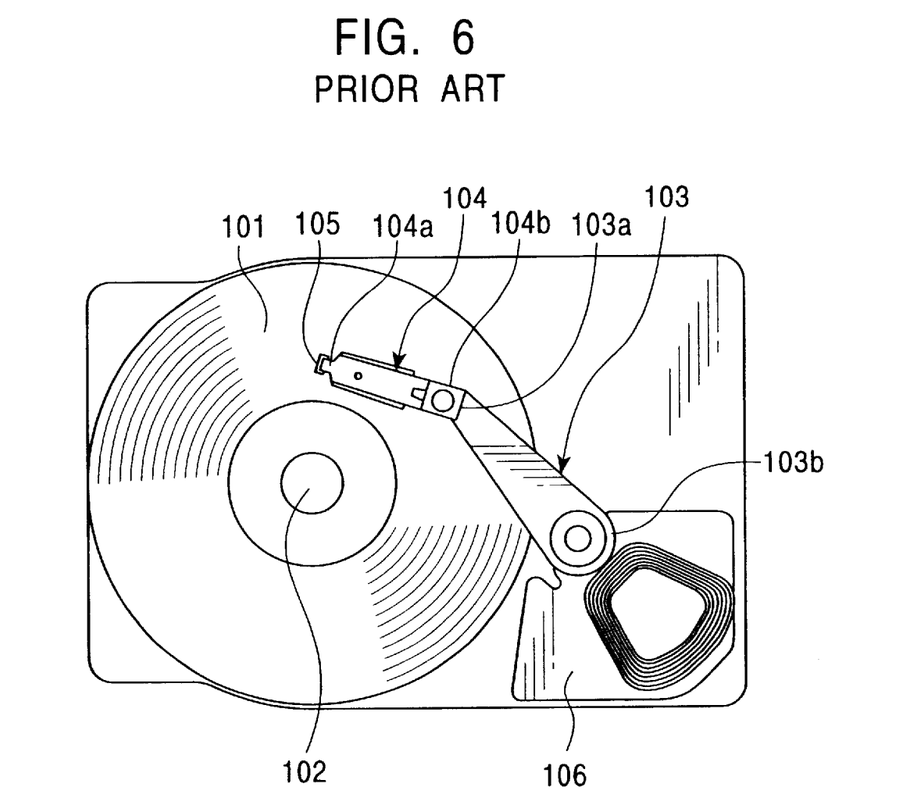
FIG. 6 is a plan view showing an example of a conventional hard disk device.

FIG. 6 is a plan view showing an example of a conventional hard disk device. The hard disk device shown in FIG. 6 comprises a magnetic disk 101, a spindle motor 102 for driving the magnetic disk 101 to rotate, a carriage 103, a load beam 104, a slider 105, and a voice coil motor 106. A magnetic head device schematically comprises the load beam 104 and the slider 105.

The base end 104b of the load beam 104 serving as a supporting member is connected to the tip 103a of the carriage 103 comprising a rigid material, and the slider 105 is mounted at the tip 104a of the load beam 104 through a flexure (not shown in the drawing).

The carriage 103 and the load beam 104 are driven in the radial direction of the magnetic disk 101 by the voice coil motor 106 to perform the seek operation of moving a reproducing element and recording element mounted on the slider 105 onto a desired recording track, and the tracking operation of finely controlling the positions of the reproducing element and the recording element to keep them on a center line of the recording track.

Furthermore, a microactuator is mounted on the load beam 104 so that only the tip of the load beam 104 can be moved by the microactuator to perform the tracking operation.

Figure 7:
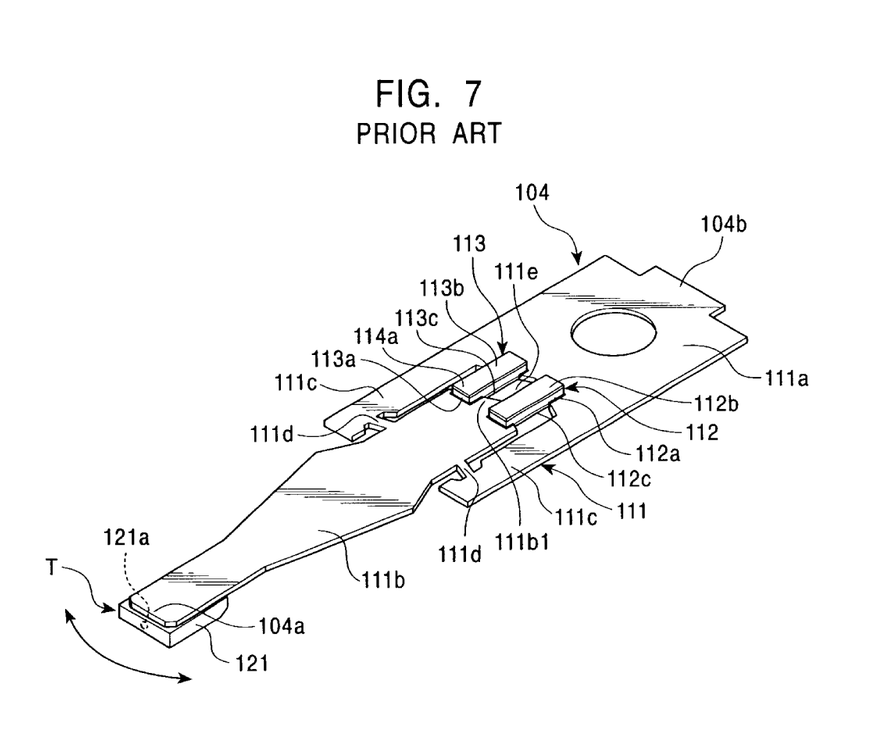
FIG. 7 is a perspective view of a conventional magnetic head device.
Figure 8:
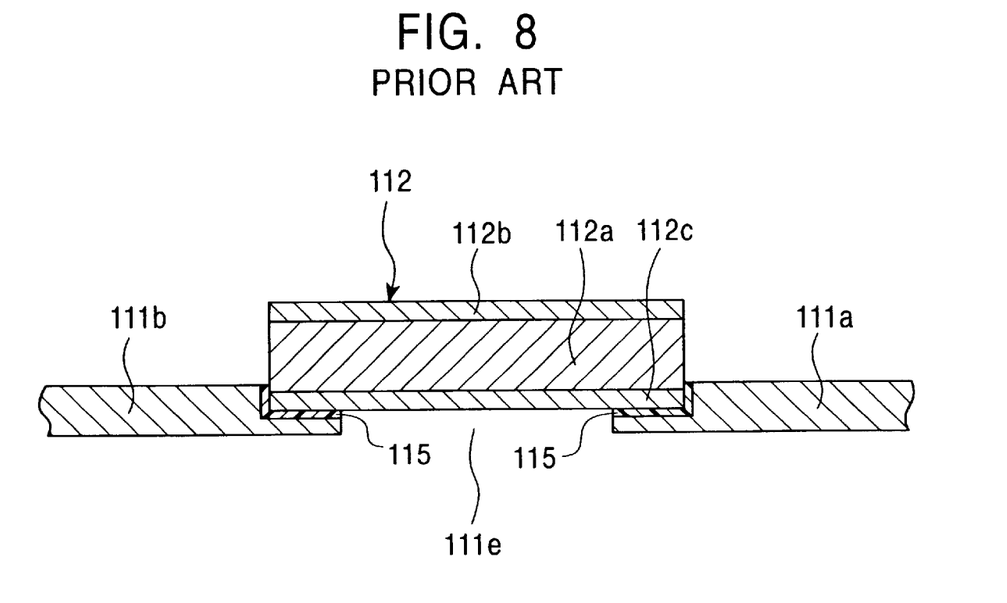
FIG. 8 is an enlarged sectional view showing a principal portion of the conventional magnetic head device shown in FIG. 7.

FIG. 7 is a perspective view of the load beam 104, and FIG. 8 is a sectional view showing the principal portion of the load beam 104 shown in FIG. 7.

The load beam 104 is made of a stainless steel leaf spring material, and comprises a fixed base end 111a held by the carriage, and an oscillating portion 111b oscillatable horizontally relative to the fixed base end 111a. The load beam 104 further comprises arms 111c formed on both sides of the front end of the fixed base end 111a to extend in the longitudinal direction of the fixed base end 111a. The oscillating portion 111b is connected to the arms 111c through elastic supporting portions 111d.

Furthermore, piezoelectric elements 112 and 113 serving as microactuators are placed over a void 111e between the oscillating portion 111b and the fixed base end 111a.

The piezoelectric elements 112 and 113 comprise piezoelectric layers 112a and 113a made of a piezoelectric material such as lead titanate zirconate (PTZ), and electrode layers 112b and 112c, and electrode layers 113b and 113c, respectively, made of gold films formed above and below the piezoelectric layers 112a and 113a.

As shown in FIG. 8, the electrode layers 112c and 113c of the piezoelectric elements 112 and 113 are bonded to the oscillating portion 111b and the fixed base end 111a with an adhesive resin 115

In FIG. 7, reference numeral 121 denotes a slider mounted at the tip of the oscillating portion 111b through a flexure (not shown in the drawing).

The piezoelectric elements 112 and 113 are elements which produce strain when a voltage is applied through the electrode layers 112b and 112c, and the electrode layers 113b and 113c, respectively.

The piezoelectric layers 112a and 113a of the piezoelectric elements 112 and 113 are polarized in the thickness direction, but the polarization directions of the piezoelectric elements 112 and 113 are opposite to each other. Therefore, when the same potential is applied to the electrode layers 112c and 113c, one of the piezoelectric elements extends in the longitudinal direction, while the other piezoelectric element shrinks in the longitudinal direction.

As a result, the elastic supporting portions 111d are deformed to change the position of the slider 121 mounted at the tip of the oscillating portion 111b. Namely, the slider 121 mounted at the tip of the oscillating portion 111b can be finely moved in the track width direction to perform the fine tracking operation.

Particularly, the precision of the tracking operation must be increased as the recording density of the magnetic disk 101 increases. However, the load beam 104 enables the precise tracking operation, and is thus adaptable for improving the recording density.

As the adhesive resin 115 for bonding the piezoelectric elements 112 and 113 and the oscillating portion 111b and the fixed base end 111a, a thermosetting epoxy resin is conventionally used. The epoxy resin is roughly classified into a one-component type and a two-component type.

However, unlike a photo-curing type, a thermosetting epoxy resin cannot be temporarily hardened by light irradiation, and thus a bonded portion must be fixed by a jig or the like until curing is completed, thereby causing the problem of deteriorating manufacturing efficiency.

With a one-component epoxy resin, a powdery curing agent is added to an epoxy solution as a main agent, and then dispersed in the epoxy solution by heating to start curing. However, the viscosity of the epoxy solution decreases until the temperature is increased to the curing temperature, thereby making the mixed state of the curing agent and the epoxy solution heterogeneous to leave an uncured portion in some cases. The uncured portion causes the occurrence of out gases, spots due to dissolution and re-adhesion of the uncured portion, etc., causing the problem of deteriorating the reliability of a magnetic head device.

With a two-component epoxy resin, unlike the one-component epoxy resin, the uncured portion does not occur. However, the viscosity greatly varies with time during mixing of the main agent and the curing agent, thereby causing the problem of complicating handling of the resin after mixing.

Therefore, in order to solve the above problems, the use of a photo-curing and thermosetting acrylic adhesive resin has recently been investigated. The acrylic adhesive resin is cured by radical polymerization, but peroxide radicals occur due to contact with atmospheric oxygen to cause reaction deactivation inhibition. This causes the problem of increasing the amount of the out gases produced, and deteriorating humidity resistance and heat resistance to deteriorate the reliability of the magnetic head device.

SUMMARY OF THE INVENTION

In consideration of the above-described present conditions, it is an object of the present invention to provide a magnetic head device having excellent reliability and comprising a piezoelectric element and a load beam which are bonded together in a good state without using a jig.

In order to achieve the object, the present invention has the following construction:

A magnetic head device of the present invention comprises a slider comprising a reproducing element for detecting magnetic signals recorded on a recording medium, and a recording element for recording magnetic signals on the recording medium; an elastic supporting member for supporting the slider; and a piezoelectric element mounted on the elastic supporting member, for deforming the elastic supporting member to change the position of the slider, wherein the piezoelectric element and the elastic supporting member are bonded together with a photo-curing and thermosetting epoxy adhesive resin having a Young's modulus of 1 GPa or more at 25° C., and a glass transition temperature of 90° C. or more.

In the magnetic head device of the present invention, the piezoelectric element and the elastic supporting member are bonded together with the photocuring and thermosetting epoxy adhesive resin, and thus the adhesive resin can be temporarily cured by light irradiation to temporarily fix the piezoelectric element without using a jig or the like, thereby increasing manufacturing efficiency.

Unlike an acrylic resin, an epoxy resin as a main component of the adhesive resin is cured by cationic polymerization, and thus does not produce reaction deactivation inhibition due to oxygen, thereby increasing the reliability of the magnetic head device.

Furthermore, since the Young's modulus at 25° C. is 1 GPa or more, and the glass transition temperature is 90° C. or more, rigidity of the adhesive resin can be kept high in the practical temperature region of 90° C. or less. Therefore, the piezoelectric element and the elastic supporting member are bonded together through a rigid material, permitting secured propagation of a displacement of the piezoelectric element to the elastic supporting member, and the precise tracking operation.

In the above-described magnetic head device of the present invention, the elastic supporting member comprises a fixed base end and an oscillating portion which is connected to the fixed base end to support the slider and which can be oscillated by the piezoelectric element relative to the fixed base end. The piezoelectric element is bonded by the photocuring and thermosetting epoxy adhesive resin so as to be placed over the space between the fixed base end and the oscillating portion.

In the magnetic head device, the piezoelectric element is bonded to the fixed base end and the oscillating portion by the photocuring and thermosetting epoxy adhesive resin, and thus the piezoelectric element is bonded to the fixed base end and the oscillating portion through a rigid material, thereby permitting a precise displacement of the oscillating portion due to the piezoelectric element.

DESCRIPTION OF THE PREFERRED EMBODIMENTS

An embodiment of the present invention will be described below with reference to the drawings.

Figure 1:
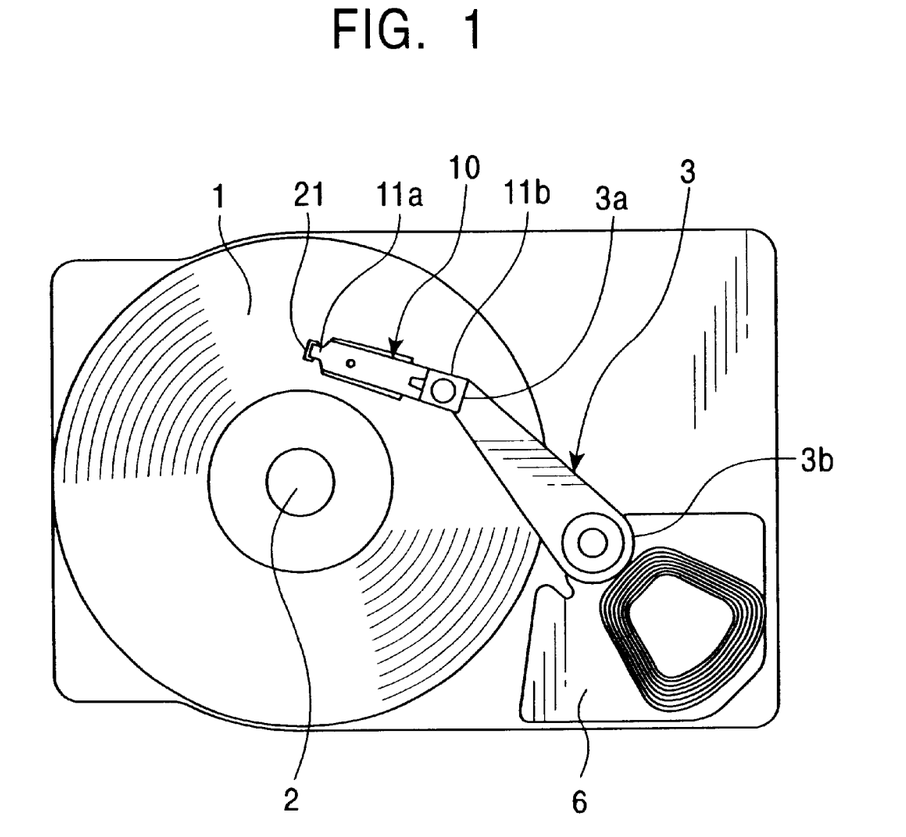
FIG. 1 is a plan view showing an example of a hard disk device comprising a magnetic head device according to an embodiment of the present invention.
Figure 2:
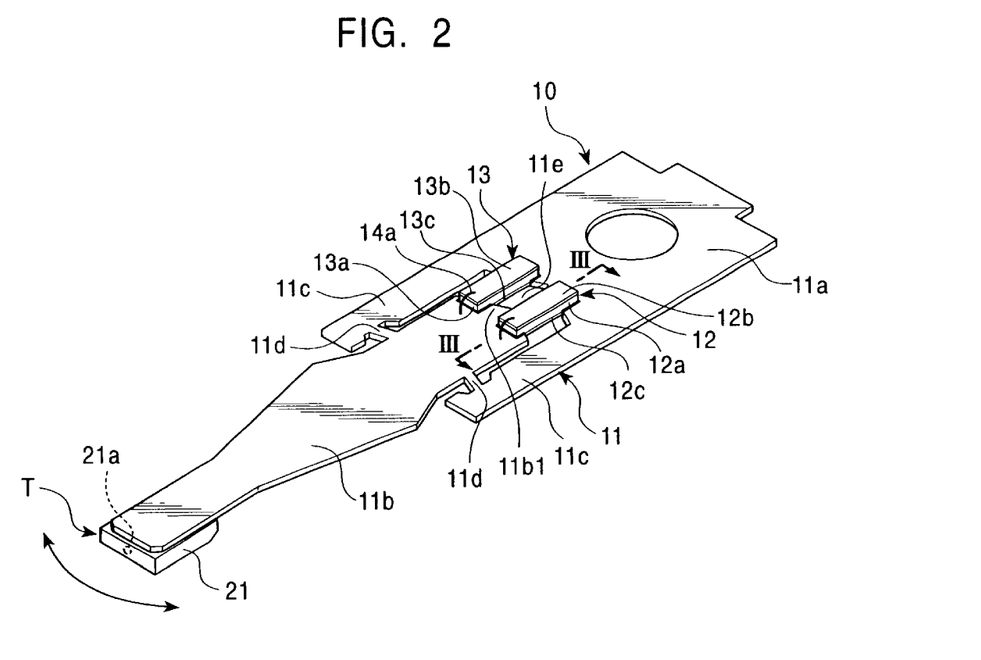
FIG. 2 is a perspective view of the magnetic head device of the embodiment shown in FIG. 1.
Figure 3:
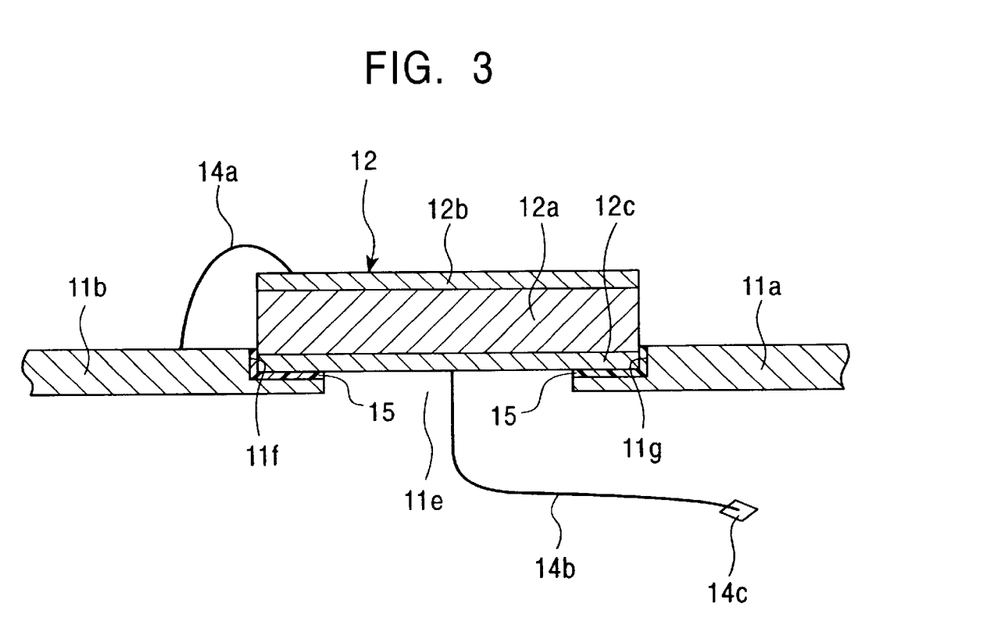
FIG. 3 is an enlarged sectional view taken long line III—III in FIG. 2.

FIG. 1 is a plan view showing an example of a hard disk device comprising a magnetic head device according to an embodiment of the present invention, FIG. 2 is a perspective view of the magnetic head of the embodiment shown in FIG. 2, and FIG. 3 is an enlarged sectional view taken along line III–III' in FIG. 2.

The hard disk device shown in FIG. 1 comprises a magnetic disk 1, a spindle motor 2 for driving the magnetic disk 1 to rotate, a carriage 3, a load beam 11 serving as an elastic supporting member, a slider 21, and a voice coil motor 6.

The load beam 11 is connected to the tip 3a of the carriage 3 serving as a rigid supporting member to be supported thereby. The voice coil motor 6 is mounted on the base end 3b of the carriage 3.

The magnetic head device 10 of the present invention schematically comprises the load beam 11 and the slider 21.

The slider 21 is made of a ceramic material, and mounted on the tip of the load beam 11. Also, as shown in FIG. 2, a thin film element 21a is provided at the trailing-side end T of the slider 21, and an ABS (flying surface) is formed on the recording medium-facing side of the slider 21.

The thin film element 21a shown in FIG. 2 is a combination type thin film element comprising both a reproducing element (MR head) for reproducing magnetic recording signals recorded on a recording medium and a recording element (inductive head) for recording magnetic signals on the recording medium. The reproducing element comprises, for example, a magnetoresistive element such as a spin valve film utilizing a magnetoresistive effect, and a shield layer made of a magnetic material. The recording element comprises a patterned core and coil both of which are made of a magnetic material.

As shown in FIG. 2, piezoelectric elements 12 and 13 are mounted on the load beam 11 serving as the elastic supporting member for supporting the slider 21.

The load beam 11 is made of a stainless steel leaf spring material, and comprises the fixed base end 11a supported by the carriage 3, and the oscillating portion 11b oscillatable horizontally relative to the fixed base end 11a. The load beam 11 further comprises arms 11c formed on both sides of the front end of the fixed base end 11a so as to extend in the longitudinal direction of the fixed base end 11a. The oscillating portion 11b is connected to the arms 11c through elastic supporting portions 11d.

The piezoelectric elements 12 and 13 are placed over the void 11e between the oscillating portion 11b and the fixed base end 11a.

As shown in FIGS. 2 and 3, the piezoelectric elements 12 and 13 comprise piezoelectric layers 12a and 13a each mainly composed of a piezoelectric material such as lead titanate zirconate (lead zirconate titanate) or the like, and a pair of electrode layers 12b and 12c, and a pair of electrode layers 13b and 12c, which hold the piezoelectric layers 12a and 13a, respectively, therebetween.

The bonded structure of the piezoelectric elements 12 and 13 and the load beam is described in further detail below with reference to FIG. 3. The oscillating portion 11b has a notch 11f provided on the void side thereof, and the fixed base end 11a also has a notch 11g provided on the void side thereof. The piezoelectric element 12 is arranged across the space between the notches 11f and 11g with the electrode layer 12c facing the notch side, i.e., facing the fixed base end 11a and the oscillating portion 11b. Furthermore, the photocuring and thermosetting epoxy adhesive resin 15 (referred to as the "adhesive resin 15" hereinafter) is coated on the notches 11f and 11g so that the piezoelectric element 12 is bonded to the notches 11f and 11g through the adhesive resin 15. Although FIG. 3 shows only the piezoelectric element 12, the bonded structure of the other piezoelectric element 13 is substantially the same as the structure shown in FIG. 3.

The load beam 11 shown in FIG. 2 is connected to an earth. The electrode layers 12b and 13b of the piezoelectric elements 12 and 13 are electrically connected to the load beam 11 through gold wires 14a to be connected to the earth. The material for electrically connecting the electrode layers 12b and 13b to the load beam 11 is not limited to the gold wires 14a, and conductive paste or the like may be used.

As shown in FIG. 3, the electrode layers 12c and 13c are connected to a gold wire 14b passing through the void 11e, the gold wire 14b being connected to a control circuit not shown in the drawing through a terminal 14c.

The piezoelectric elements 12 and 13 are elements which produce strain when a voltage is applied to the electrode layers 12b and 12c, and the electrode layers 13b and 13c, respectively. By applying a voltage, the piezoelectric layers 12a and 13a of the piezoelectric elements 12 and 13 are polarized in the thickness direction. However, the polarization directions of the piezoelectric elements 12 and 13 are opposite to each other, and when the same voltage is applied to the electrode layers 12c and 13c through the gold wires 14b, one of the piezoelectric elements extends in the longitudinal direction, while the other piezoelectric element shrinks in the longitudinal direction.

As a result, the elastic supporting portions 11d are distorted to change the position of the slider 21 mounted at the tip of the oscillating portion 11b. Namely, the slider 21 mounted at the tip of the oscillating portion 11b can be moved in the track width direction (the direction of a double arrow shown in FIG. 2), permitting the tracking operation.

The adhesive resin 15 used for bonding the piezoelectric elements 12 and 13 to the fixed base end 11a and the oscillating portion 11b is an epoxy adhesive resin referred to as a "photocuring and thermosetting type", and cured by either of ultraviolet irradiation and heating. The adhesive resin 15 has the property that the Young's modulus in a cured state at 25° C. is 1 GPa or more, and the glass transition temperature is 90° C. or more.

In the magnetic head device of the present invention, the oscillating portion 11b is oscillated due to displacements of the piezoelectric elements 12 and 13, and thus the piezoelectric elements 12 and 13 must be bonded to the fixed base end 11a and the oscillating portion 11b through a rigid material. Therefore, the adhesive resin 15 used in the present invention must be rigid in the practical temperature region of the magnetic head device.

The flexibility of an adhesive resin is mainly determined by the Young's modulus and the glass transition temperature. Therefore, in the present invention, by setting the Young's modulus and the glass transition temperature of the adhesive resin 15 to 1 GPa or more and 90° C. or more, respectively, sufficient rigid bonding can be realized.

Namely, when the Young's modulus of the adhesive resin 15 at 25° C. is 1 GPa or more, the rigidity of the adhesive resin 15 itself is improved to decrease the displacement of the adhesive resin 15 with an external stress applied, thereby permitting secured transmission of the displacements of the piezoelectric elements 12 and 13 to the fixed base end 11a and the oscillating portion 11b. Therefore, the oscillating portion 11b can be precisely displaced without absorption of the displacements of the piezoelectric elements 12 and 13 by the adhesive resin 1, improving the precision of the tracking operation.

Furthermore, the glass transition temperature of the adhesive resin 15 is preferably in the range of 90° C. to 200° C. With the glass transition temperature of 90° C. or more, the Young's modulus is not extremely decreased at 5 to 60° C. in the practical temperature region of the magnetic head device to maintain the rigidity of the adhesive resin 15 itself. Thus, the oscillating portion 11b can be precisely displaced without absorption of the displacements of the piezoelectric elements 12 and 13 by the adhesive resin 15, thereby improving the precision of the tracking operation.

The reason for setting the glass transition temperature to 200° C. or less is that the epoxy adhesive resin 15 has a heat resistance temperature of 200° C. or less, and is thermally decomposed at a temperature exceeding 200° C., and it is thus impractical to set the upper limit of the glass transition temperature to 200° C. or more.

The glass transition temperature of the adhesive resin 15 can be controlled by controlling the thermosetting conditions of the adhesive resin 15. For example, the glass transition temperature is 90° C. in the case of curing by heating at 110° C.; the glass transition temperature is about 100° C. in the case of curing by heating at 130° C. However, this depends on the type of the adhesive resin used. Namely, the glass transition temperature is about 20 to 30° C. lower than the curing temperature.

As described above, the adhesive resin 15 used in the present invention is referred to as the "photocuring and thermosetting type", and can be cured by either of ultraviolet irradiation and heating. By utilizing this property, the manufacturing efficiency of the magnetic head device can be improved.

Namely, as shown in FIG. 3, the adhesive resin 15 is coated in an uncured state on the notches 11f and 11g, and the piezoelectric elements 12 and 13 are arranged over the space between the fixed base end 11a and the oscillating portion 11b. Then, the adhesive resin 15 is partially cured by ultraviolet irradiation to temporarily fix the piezoelectric elements 12 and 13 to the fixed base end 11a and the oscillating portion 11b. In this state, the bonded positions of the piezoelectric elements 12 and 13 are checked to examine whether or not a problem with design occurs. If it is confirmed that there is no problem with design, the adhesive resin 15 is thermally set by heating.

In this way, the piezoelectric elements 12 and 13 are temporarily fixed by ultraviolet irradiation, and then the adhesive resin 15 is completely thermally set, thereby eliminating the need for a jig for temporarily fixing the piezoelectric elements 12 and 13. This can improve the manufacturing efficiency of the magnetic head device.

EXAMPLE

Experimental Example 1

Examination of the Relation between Displacement of a Slider and the Young's Modulus of an Adhesive Resin The relationship between displacement of a slider and the Young's modulus of an adhesive resin was examined.

The slider was mounted at the tip of the load beam shown in FIG. 2, and a photocuring and thermosetting epoxy adhesive resin was coated on each of notches of the oscillating portion and the fixed base end of the load beam. Then, a piezoelectric element was mounted and bonded to the load beam by curing the adhesive resin by ultraviolet irradiation and heating to manufacture a magnetic head device.

The thus-manufactured magnetic head device was incorporated into the hard disk device shown in FIG. 1, and a voltage of ±30 V (frequency 1 kHz) was applied to the piezoelectric element to perform the tracking operation by the slider. At this time, the displacement of the slider was measured. The results are shown in FIG. 4.

Figure 4:
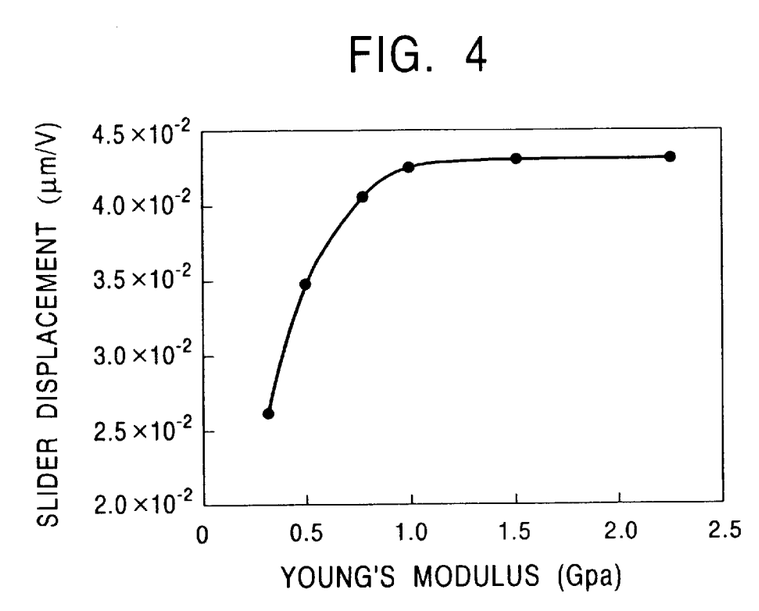
FIG. 4 is a graph showing the relation between the displacement of a slider and the Young's modulus of an adhesive resin.

FIG. 4 shows the relationship between the displacement of the slider in the track width direction and the Young's modulus of the adhesive resin. The Young's modulus was measured at 25° C.

FIG. 4 indicates that with the Young's modulus in the range of 1 GPa or more, the displacement of the slider becomes substantially constant at a value exceeding $4\times10^{-2}$ ($\mu$m/V). On the other hand, with the Young's modulus in the range of less than 1 GPa, the displacement of the slider decreases as the Young's modulus decreases.

Since the displacement of the slider is relatively high and constant when the Young's modulus is 1 GPa or more, the piezoelectric element is possibly bonded to the load beam through a rigid material, and the displacement of the piezoelectric element is possibly reflected in the displacement of the slider without being absorbed by the adhesive resin.

On the other hand, with the Young's modulus of less than 1 GPa, the displacement of the slider changes with changes in the Young's modulus. It is thus found that the piezoelectric element is bonded to the load beam through an elastic material, and the displacement of the piezoelectric element is absorbed by the adhesive resin, thereby making it impossible for the slider to be displaced following the displacement of the piezoelectric element.

Therefore, by setting the Young's modulus of the adhesive resin to 1 GPa or more, the slider can precisely perform the tracking operation.

Figure 5:
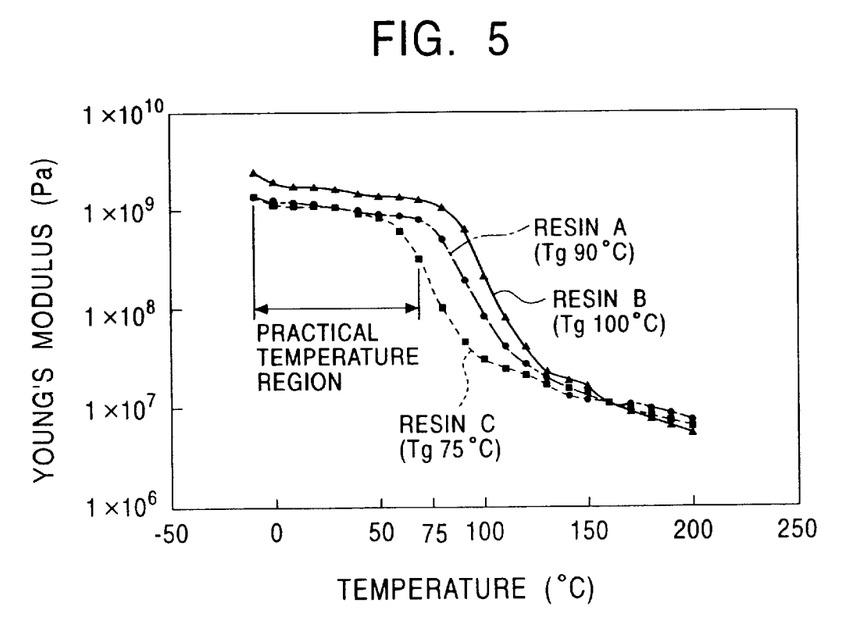
FIG. 5 is a graph showing the temperature dependency of the Young's modulus of an adhesive resin.

FIG. 5 shows the temperature dependency of the Young's modulus of each of adhesive resins having glass transition temperatures of 75 to 100° C. The adhesive resin having a glass transition temperature Tg of 90° C. was cured by heating at 110° C.; the adhesive resin having a glass transition temperature Tg of 100° C. was cured by heating at 130° C.; the adhesive resin having a glass transition temperature Tg of 75° C. was cured by heating at 85° C.

FIG. 5 indicates that the adhesive resins each having a glass transition temperature of 90° C. or more exhibit a Young's modulus of $1\times10^9$ Pa (1 GPa) or more in the practical temperature region of 0 to 75° C.

It is also found that the adhesive resin having a glass transition temperature of 75° C. exhibits a Young's modulus of $1\times10^9$ Pa (1 GPa) or less at 50° C. or more.

Therefore, by using an adhesive resin having a glass transition temperature of 90° C. or more, the piezoelectric element can be bonded to the load beam through a rigid material in the practical temperature region of 75° C. or less, thereby permitting the precise tracking operation.

As described in detail above, in a magnetic head device of the present invention, a piezoelectric element is bonded to an elastic supporting member with a photocuring and thermosetting epoxy adhesive resin, and thus the adhesive resin can be temporarily curded by light irradiation to temporarily fix the piezoelectric element without using a jig or the like. This can improve the manufacturing efficiency.

Also, unlike an acrylic resin, an epoxy resin as a main component of the adhesive resin is cured by cationic polymerization, and thus does not produce reaction deactivation inhibition due to oxygen. Therefore, the reliability of the magnetic head device can be improved.

Furthermore, the adhesive resin has a Young's modulus of 1 GPa or more at 25° C., and a glass transition temperature of 90° C. or more, and thus rigidity of the adhesive resin can be maintained at a high level in the practical temperature region of 90° C. or less. This can achieve bonding of the piezoelectric element and the elastic supporting member through a rigid material, and thus permits precise transmission of the displacement of the piezoelectric element to the elastic supporting member and the precise tracking operation.

What is claimed is:

1. A method of manufacturing a magnetic head device comprising a slider comprising a reproducing element for detecting a magnetic signal recorded on a recording medium and a recording element for recording a magnetic signal on the recording medium; an elastic supporting member for supporting the slider; and a piezoelectric element mounted on the elastic supporting member for distorting the elastic supporting member to change the position of the slider, wherein the method comprises that step of bonding the piezoelectric element and the elastic supporting member together with an epoxy adhesive resin, the epoxy adhesive resin being a photo-curing and thermosetting epoxy adhesive resin having a Young's modulus of 1 GPa or more at 250° C., and a glass transition temperature of 90° C. or more.

2. The method of manufacturing the magnetic head device according to claim 1:

wherein the elastic supporting member comprises a fixed base end and an oscillating portion which is connected to the fixed base end to support the slider and which can be oscillated by the piezoelectric element relative to the fixed base end; and wherein the piezoelectric element is bonded by the photocuring and thermosetting epoxy adhesive resin so as to be placed over the space between the fixed base end and the oscillating portion.

* * * * *

UNITED STATES PATENT AND TRADEMARK OFFICE
CERTIFICATE OF CORRECTION

PATENT NO. : 6,791,802 B2
DATED : September 14, 2004
INVENTOR(S) : Mitsuru Watanabe et al.

It is certified that error appears in the above-identified patent and that said Letters Patent is hereby corrected as shown below:

Column 8,
Line 42, after "more at" delete "250º C.," and substitute -- 25º C, -- in its place.
Line 43, delete "90º C." and substitute -- 90º C -- in its place.

Signed and Sealed this

Twenty-ninth Day of November, 2005

JON W. DUDAS
*Director of the United States Patent and Trademark Office*